United States Patent [19]

Cripps et al.

[11] Patent Number: 5,444,737
[45] Date of Patent: Aug. 22, 1995

[54] WIRELESS DATA TRANSCEIVER

[75] Inventors: Peter K. Cripps, Redwood City; Tomany Szilagyi, Felton, both of Calif.

[73] Assignee: National Semiconductor Corporation, Santa Clara, Calif.

[21] Appl. No.: 150,401

[22] Filed: Nov. 10, 1993

Related U.S. Application Data

[63] Continuation-in-part of Ser. No. 57,621, May 5, 1993.

[51] Int. Cl.⁶ .......................... H04B 1/38; H04L 5/16
[52] U.S. Cl. ........................... 375/219; 455/126
[58] Field of Search .............. 375/59, 60, 37, 58, 375/75, 99, 7; 455/126, 73, 84, 85, 86, 317; 370/32, 32.1

[56] References Cited

U.S. PATENT DOCUMENTS

| | | | |
|---|---|---|---|
| 3,162,724 | 12/1964 | Ringelhaan | 178/68 |
| 3,167,712 | 1/1965 | Young et al. | 375/65 |
| 3,230,310 | 1/1966 | Brogle, Jr. | 178/68 |
| 3,495,032 | 2/1970 | Smith | 178/6 |
| 3,631,463 | 12/1971 | Murphy | 340/347 |
| 3,723,880 | 3/1973 | Van Gerwen | 325/38 A |
| 4,063,235 | 12/1977 | Ludwig | 340/347 |
| 4,087,642 | 5/1978 | Jessop et al. | 179/15 BM |
| 4,282,601 | 8/1981 | Flora | 375/20 |
| 4,361,904 | 11/1982 | Matsumura | 375/7 |
| 4,397,042 | 8/1983 | Tsujii et al. | 375/110 X |
| 4,411,005 | 10/1983 | Leslie | 375/65 |
| 4,618,941 | 10/1986 | Linder et al. | 364/724 |
| 4,665,531 | 5/1987 | Aly | 375/17 |
| 4,759,078 | 7/1988 | Schiller | 455/49 |
| 5,095,497 | 3/1992 | Aman et al. | 375/60 |
| 5,101,505 | 3/1992 | Schiller et al. | 455/86 |
| 5,107,520 | 4/1992 | Karam et al. | 455/126 |
| 5,109,545 | 4/1992 | Schiller et al. | 455/317 |
| 5,119,402 | 6/1992 | Ginzburg et al. | 375/17 |
| 5,148,448 | 8/1992 | Karam et al. | 455/126 |
| 5,166,956 | 11/1992 | Baltus et al. | 375/17 |
| 5,259,007 | 11/1993 | Yamamoto | 375/120 |
| 5,303,265 | 4/1994 | McLean | 375/17 |
| 5,313,173 | 5/1994 | Lampe | 332/103 |
| 5,323,125 | 6/1994 | Hiben et al. | 332/100 |
| 5,355,513 | 10/1994 | Clarke et al. | 455/20 |

FOREIGN PATENT DOCUMENTS

| | | |
|---|---|---|
| 1122801 | 8/1968 | United Kingdom . |
| 2122456 | 1/1984 | United Kingdom . |
| WO9112672 | 8/1991 | WIPO . |

Primary Examiner—Stephen Chin
Assistant Examiner—Tesfaldet Bocure
Attorney, Agent, or Firm—Limbach & Limbach; H. Donald Nelson; Richard J. Roddy

[57] ABSTRACT

A full duplex data transceiver for transmitting and receiving trinary frequency-modulated ("FM") signals representing binary data includes at least one antenna and a single oscillator which serves as both the radio frequency ("RF") signal source for the transmitter and the local oscillator ("LO") signal source for the receiver. During signal transmission, the oscillator output is frequency-modulated to provide a FM transmit signal to the antenna. The oscillator output is frequency-modulated with binary transmit data by modulating an error feedback signal which serves as the control voltage for a voltage-controlled oscillator in a phase-lock-loop, thereby producing the FM transmit signal. During signal reception, the oscillator output, in the form of the transmitted FM signal, is attenuated and coupled into the receiver along with a FM receive signal from the antenna, or alternatively is received via a separate receive antenna along with the FM receive signal, for mixing therewith to down-convert the FM receive signal. As part of the demodulation of the down-converted FM receive signal, the binary transmit data is subtracted out. The FM transmit and receive signals are trinary ($f_{-P}$, $f_C$, $f_{+P}$) and represent encoded binary data. The center frequency $f_C$ corresponds to an absence of a binary data signal transition, the lower peak frequency $f_{-P}$ corresponds to a negative binary data signal transition and the upper peak frequency $f_{+P}$ corresponds to a positive binary data signal transition.

28 Claims, 11 Drawing Sheets

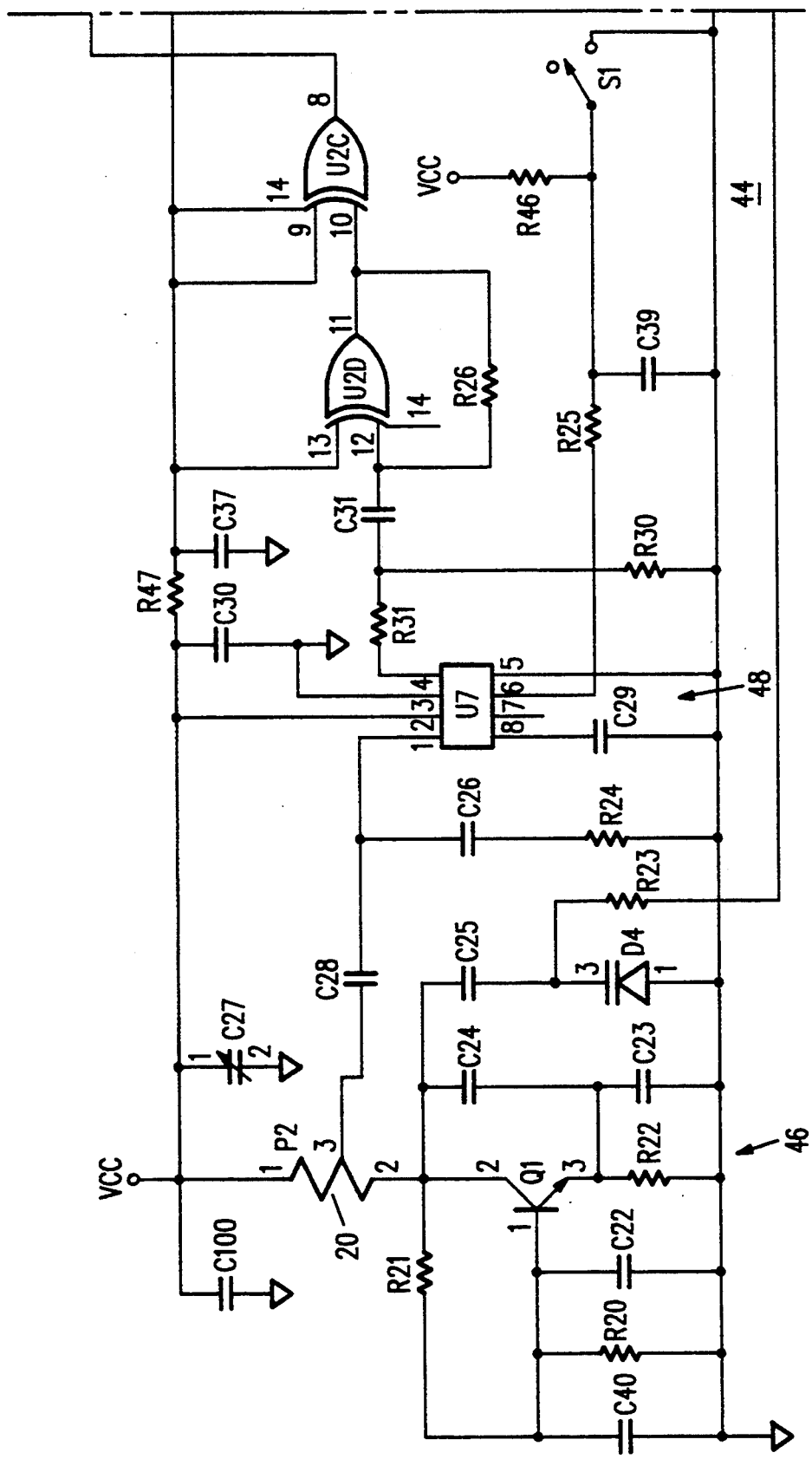
FIG. 5A(1)

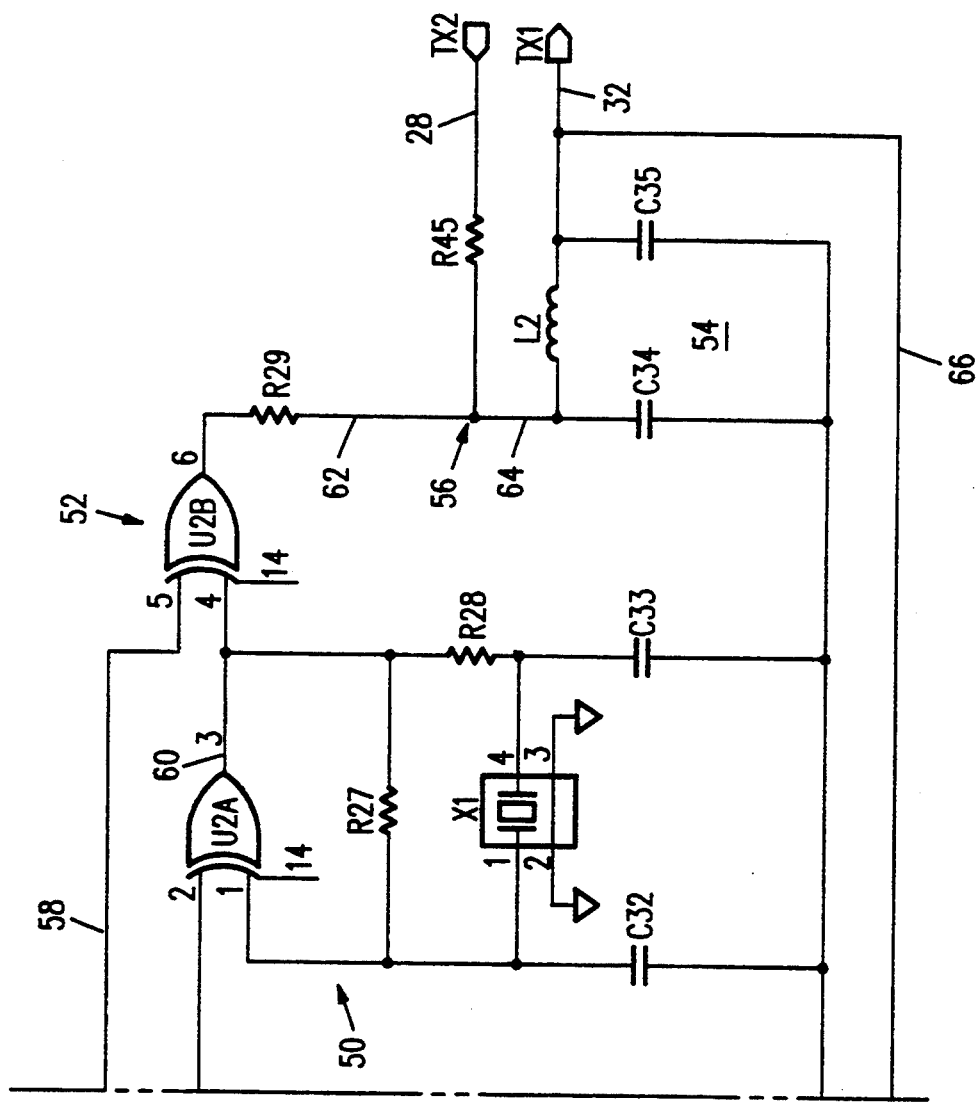
FIG. 5A(2)

WIRELESS DATA TRANSCEIVER

RELATED APPLICATION

This is a Continuation-In-Part of application Ser. No. 08/057,621, filed May 5, 1993.

BACKGROUND OF THE INVENTION

1. Field of the Invention

The present invention relates to wireless data transceivers, and in particular, to asynchronous, full duplex wireless data MODEMs with data encoding and decoding.

2. Description of the Related Art

As modern computer systems have moved away from centralized processing, such as with mainframe computers, toward more distributed processing, such as with personal, or desktop, computers, the need for providing reliable communications between the remote processing elements has become greater. A common and conventional communication link has been a data transceiver often referred to as a MODEM (MODulator/DEModulator) in which data is modulated, transmitted over the communication medium, and then demodulated at the receiving end.

Perhaps one of the most common MODEMs is one in which the data is transmitted and received over telephone lines. These types of MODEMs, as well as many other types, rely on a "hard-wired" connection and typically operate in a simplex or half duplex mode. However, hard-wired communication links tend to restrict the mobility of the users. Further, any reconfiguration of the communication link requires the time and expense of relocating, or otherwise reconfiguring, the hard-wired connections, e.g. installing and/or relocating cables.

Accordingly, a solution has been developed which has seen increased use as wireless communications technology advances, namely wireless MODEMs. Such MODEMs continue to transmit and receive data but do so without using wires or cabling as the communication medium. Instead, data transmission is accomplished wirelessly, i.e. "over-the-air", with the atmosphere (or space) as the communication medium. This results in a significant increase in mobility of the users, as well as enhanced opportunities to operate in a full duplex communication mode.

Various types of wireless MODEMs have been proposed. For example, the MODEM described in U.S. Pat. No. 4,759,078 provides for wireless data communication by transmitting data via a "leaky" local oscillator which has been modulated by the data intended to be transmitted, and receiving wireless data via a receive antenna and down-converting it with the aforementioned local oscillator. However, upon closer scrutiny of the proposed MODEM, a number of disadvantages will be realized.

One disadvantage results from the very feature which is expressly intended to be advantageous, namely the use of a "leaky" local oscillator for signal transmission whereby a separate transmit antenna is unnecessary. A problem with this is that it is difficult, if not impossible, to determine just how "leaky" the oscillator must be for reliable signal transmission. Further, by purposely causing the local oscillator to be "leaky", interference with or self-jamming of the companion receiver would be difficult to avoid, particularly with a hard-wired RF interface used to convey the local oscillator signal from the transmitter section in which it resides to the receiver section for use therein as the local oscillator for down-conversion of the received signal. Hence, while maintaining a sufficiently "leaky" local oscillator to effect data transmission, it becomes much more critical to provide reliable RF shielding for the receiver, particularly the intermediate frequency ("IF") section, from outside radiation interference. Moreover, full duplex operation of this type of transceiver would further suffer from interference with the receive signal due to the presence of modulation on the internal local oscillator.

Therefore, it would be desirable to have a simple wireless data transceiver which would allow for full duplex operation and simple, reliable data modulation and demodulation.

SUMMARY OF THE INVENTION

A data transceiver in accordance with a preferred embodiment of the present invention uses separate transmit and receiver antennas for transmitting and receiving data-modulated signals, respectively. A single local oscillator provides both the RF carrier for the transmit signal and the local oscillator ("LO") signal for the down-conversion of the receive signal in the receiver section. The LO signal is conveyed from the transmitter section to the receiver section in the form of the radiated transmit signal from the transmit antenna to the receive antenna. Full duplex operation is achieved by cancelling out the transmit data from the down-converted receive signal which has been introduced by the modulated transmit signal used as the LO signal, and by setting the carrier of the local oscillator at a frequency which is offset from that of the incoming data-modulated carrier signal by an amount equal to the desired intermediate frequency.

A data transceiver in accordance with an alternative preferred embodiment of the present invention uses a single antenna for transmitting and receiving the modulated signals. Conveyance of the LO signal from the transmitter section to the receiver section is effected by coupling a portion of the transmit signal which is intended to be radiated from the antenna into the receiver via a signal coupler.

In further accordance with the present invention, a frequency modulator is provided in which a phase-lock-loop is used for generating a frequency-modulated signal. The phase-lock-loop receives a reference signal and generates an output signal which is synchronized to the reference signal in accordance with an internally generated frequency control signal. A modulator receives a binary data signal and in accordance therewith modulates the frequency control signal, which in turn causes the output signal frequency to be modulated.

In still further accordance with the present invention, a binary-to-trinary data encoder is provided for encoding binary data to trinary data. The first of the three trinary data values corresponds to an absence of binary data transitions, the second of the three trinary data values corresponds to positive binary data transitions, and the third of the three trinary data values corresponds to negative binary data transitions. In a preferred embodiment of the present invention, the trinary data values are represented by a frequency-modulated signal in which one of three frequencies each represents one of the trinary data values.

In still further accordance with the present invention, a trinary-to-binary data decoder is provided. A demodulator receives and demodulates a trinary modulated signal to produce a demodulated trinary signal containing trinary data. A decoder decodes the demodulated trinary signal to a binary signal which contains binary data corresponding to the trinary data. In a preferred embodiment of the present invention, the demodulator is a frequency demodulator and the trinary modulated signal is a frequency-modulated signal.

These and other features and advantages of the present invention will be understood upon consideration of the following detailed description of the invention and the accompanying drawings.

BRIEF DESCRIPTION OF THE DRAWINGS

FIGS. 5A1-5A2, 5B and 5C together are a schematic diagram of a preferred embodiment of the data transceiver of FIG. 2.

DETAILED DESCRIPTION OF THE INVENTION

Figure 1:
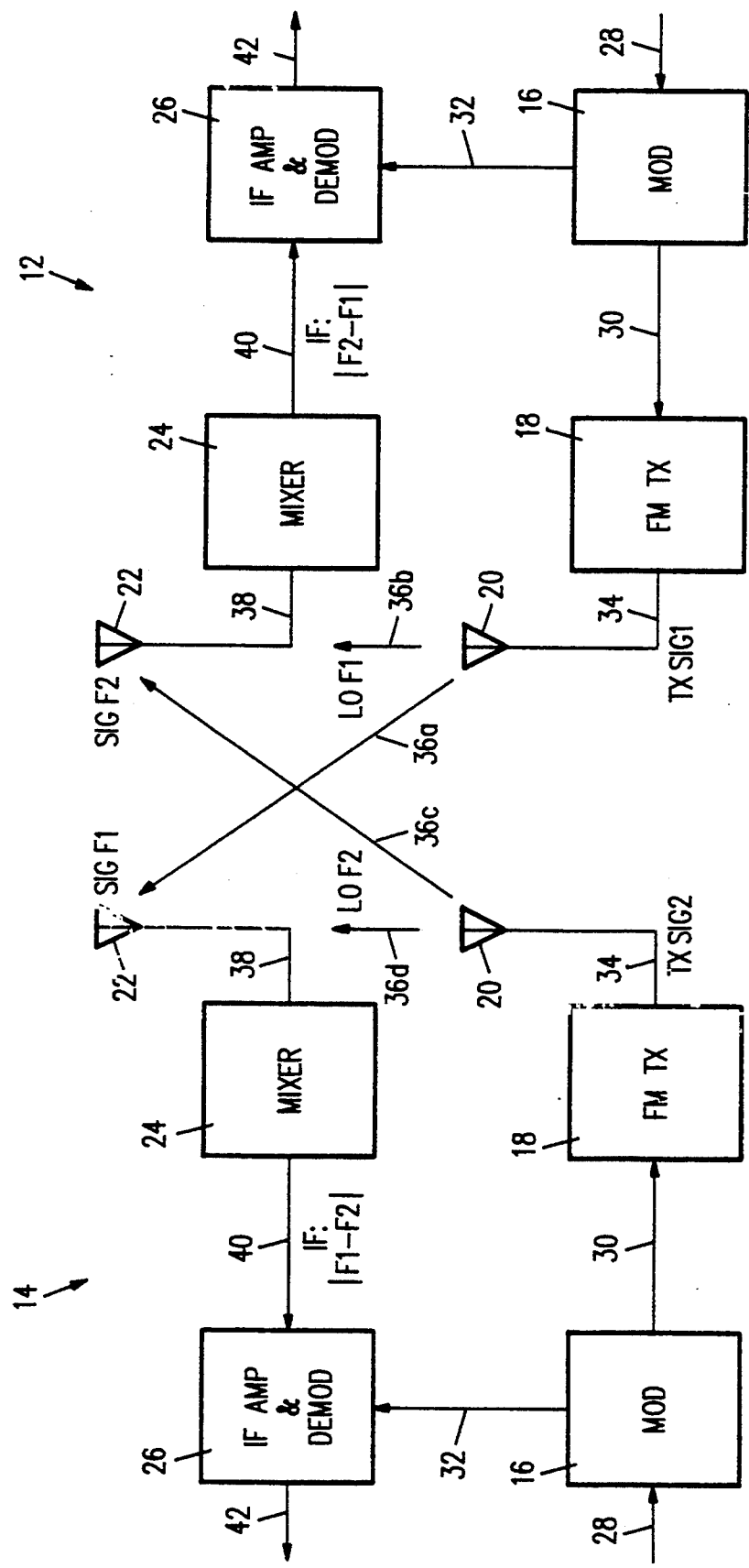
FIG. 1 is a functional block diagram of two data transceivers in accordance with a preferred embodiment of the present invention.

Referring to FIG. 1, a communication system 10 using two data transceivers 12, 14 in accordance with a preferred embodiment of the present invention includes two each of the following elements: modulator 16; frequency modulator-transmitter 18; transmitter antenna 20; receiver antenna 22; mixer 24; and IF amplifier and demodulator 26 (all connected substantially as shown). As should be understood, the modulator 16 and frequency modulator-transmitter 18 constitute the transmitter section, and the mixer 24 and IF amplifier and demodulator 26 constitute the receiver section.

The discussion that follows is addressed specifically to the first transceiver 12, but it should be understood that the second transceiver 14 operates in a similar fashion, with the exception of its transmit and receive frequencies as discussed further below.

During signal transmission, the modulator 16 receives binary transmit data 28 as its input modulation signal, and in accordance therewith provides a modulation signal 30 to the modulator-transmitter 18. The modulator 16 also provides a modulation feedback signal 32 to the IF amplifier and demodulator 26 in the receiver for use in cancellation of the transmit data from the demodulated receive signal (discussed further below).

The modulator-transmitter 18 outputs a modulated RF signal 34 (with carrier frequency F1), modulated by its input modulation signal 30, to the transmitter antenna 20. One component 36a of the radiated transmit signal is received by the second transceiver 14, and another component 36b is received by the receiver antenna 22 of the subject transceiver 12 for use as its receiver LO signal (discussed further below).

During signal reception, the receiver antenna 22 receives a modulated RF signal 36c from the second transceiver 14 and the transmitted modulated RF signal 36b from its companion transmitter. The resulting combined signal 38 is received by the mixer 24 which mixes the two signal components to produce an IF signal 40. The IF signal 40 has a center frequency F3 which is equal to the difference between the transmitter carrier frequency F1 of the companion transmitter and the transmitter carrier frequency F2 of the second transceiver 14 ($F3 = |F1 - F2|$).

The IF amplifier and demodulator 26 receives the IF signal 40, demodulates it and outputs the resulting receive binary data 42. As discussed further below, this demodulation uses a modulation feedback signal 32 to cancel out the effects of the modulation of the transmit signal 36b used as the local oscillator in the receiver.

Full duplex operation of the two transceivers 12, 14 is achieved by offsetting their respective transmit carrier frequencies F1 and F2 by that amount desired to be used as the IF frequency F3. Full duplex operation is enhanced by using a modulation feedback signal 32 representing the transmitter modulation to cancel out modulation effects within the receiver IF signal 40 due to the use of the transmitted modulated RF signal 36b as the receiver local oscillator.

An advantage of the circuit topology of FIG. 1 is the lack of a requirement for a hard-wired RF interface between the receiver and transmitter, even though only a single local oscillator is used. In other words, even though the sole local oscillator is resident within the transmitter, it need not be hard-wired to the receiver to provide a LO signal thereto, since the LO signal for the receiver is supplied via the transmitter and receiver antennas 20, 22 as the transmit signal 36b. Hence, a much lower frequency interface is all that is needed, i.e. to provide the modulation feedback signal 32.

Figure 2:
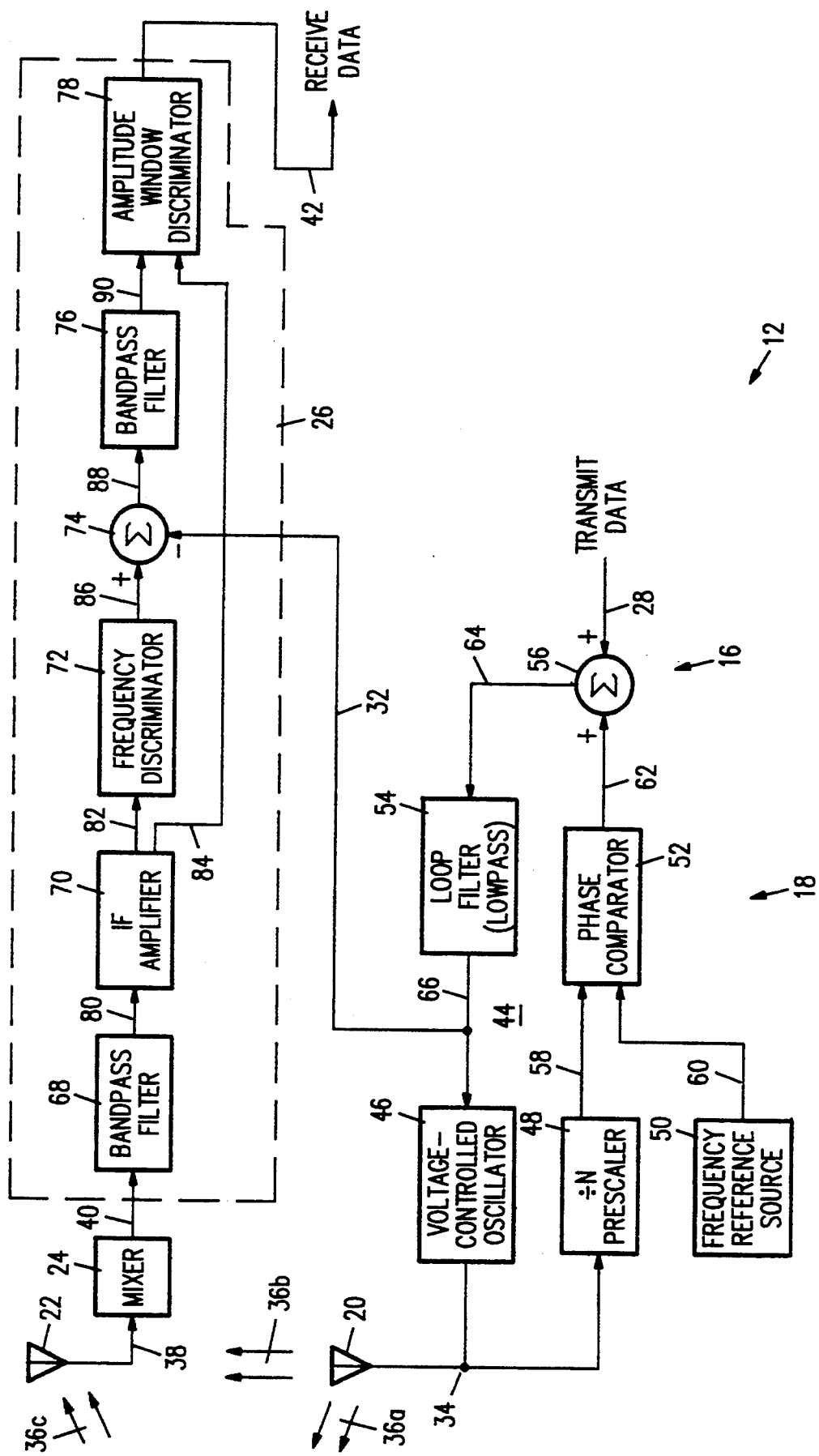
FIG. 2 is a functional block diagram of a data transceiver in accordance with the present invention.

Referring to FIG. 2, a preferred embodiment of a data transceiver 12 in accordance with the present invention can be better understood. The transmitter, namely the modulator 16 and frequency modulator-transmitter 18, is constructed from a phase-lock-loop ("PLL") 44 which includes: voltage-controlled oscillator ("VCO") 46; divide-by-N prescaler 48; frequency reference source 50; phase comparator 52; lowpass loop filter 54; and signal summer 56 (all connected substantially as shown).

The VCO 46 produces a RF output signal 34 which is received by the prescaler 48. The prescaled signal 58 is received by the phase comparator 52, along with a reference signal 60 from the frequency reference source 50. The phase comparator 52 compares the relative phases of the prescaled 58 and reference 60 signals and produces an error signal 62 representing the difference between those signal phases. The signal summer 56 receives the error signal 62 and sums it with the transmit data 28. The sum signal 64 is lowpass filtered by the loop filter 54 to produce the frequency control signal 66 for the VCO 46.

As should be understood, with no transmit data 28 applied, i.e. with the transmit data 28 equal to a "zero" value, the sum signal 64 is the same as the error signal 62. Under these conditions, the PLL 44 is in a synchronized state, meaning that the phase of the VCO 46 output 34 is synchronized, or locked, with that of the reference signal 60. With transmit data 28 applied, the sum signal 64, and therefore the VCO frequency control signal 66, become modulated by the transmit data 28, thereby causing the RF output signal 34 of the VCO 46 to be frequency-modulated. It is this RF signal 34 (which is frequency-modulated) that is transmitted via the transmitter antenna 20.

As noted above and discussed further below, the filtered sum signal 66 is conveyed as the modulation feedback signal 32 to the receiver section. The receiver, as discussed above, has a receiver antenna 22 and mixer 24. The IF amplifier and demodulator 26 is made up of a serial combination of: bandpass filter 68; IF amplifier 70; frequency discriminator 72; signal summer 74; bandpass filter 76; and amplitude window discriminator 78 (all connected substantially as shown).

The receive signal 36c from the other data transceiver 14 is received by the receiver antenna 22, as is the transmitted signal 36b from the companion transmitter. As discussed above, the combined signals 38 are received and mixed within the mixer 24 to produce the IF signal 40. A bandpass filter 68 filters the IF signal to reduce incoming signal noise and spurious signals. The filtered signal 80 is amplified by the IF amplifier 70. The IF amplifier 70 produces an amplified IF signal 82 which goes to the frequency discriminator 72 for demodulation thereof in the form of frequency discrimination.

The IF amplifier 70 also produces a DC signal which is proportional to the logarithm of the input signal 80 to the IF amplifier 70 and thereby represents the signal strength of that signal 70. Accordingly, this DC signal 84 is commonly referred to as a "receive signal strength indicator" ("RSSI") signal.

The demodulated signal 86 is summed differentially within the signal summer 74 with the transmit data modulation feedback signal 32. This causes the effects of the transmit data within the demodulated signal 86 to be netted, e.g. subtracted, out. The resulting difference signal 88 is filtered once again by a bandpass filter 76. This filtered signal 90 goes to the amplitude window discriminator 78, along with the RSSI signal 84 from the IF amplifier 70 (discussed above).

The filtered, demodulated signal 90 is amplitude window-discriminated, i.e. compared in amplitude against two amplitude thresholds, within the amplitude window discriminator 78 to decode the trinary data back to binary data (discussed further below). The RSSI signal 84 from the IF amplifier 70 is used to enable the amplitude window discriminator 78 (discussed further below). The decoded, i.e. binary, data constitutes the outputted receive data 42.

Figure 3:
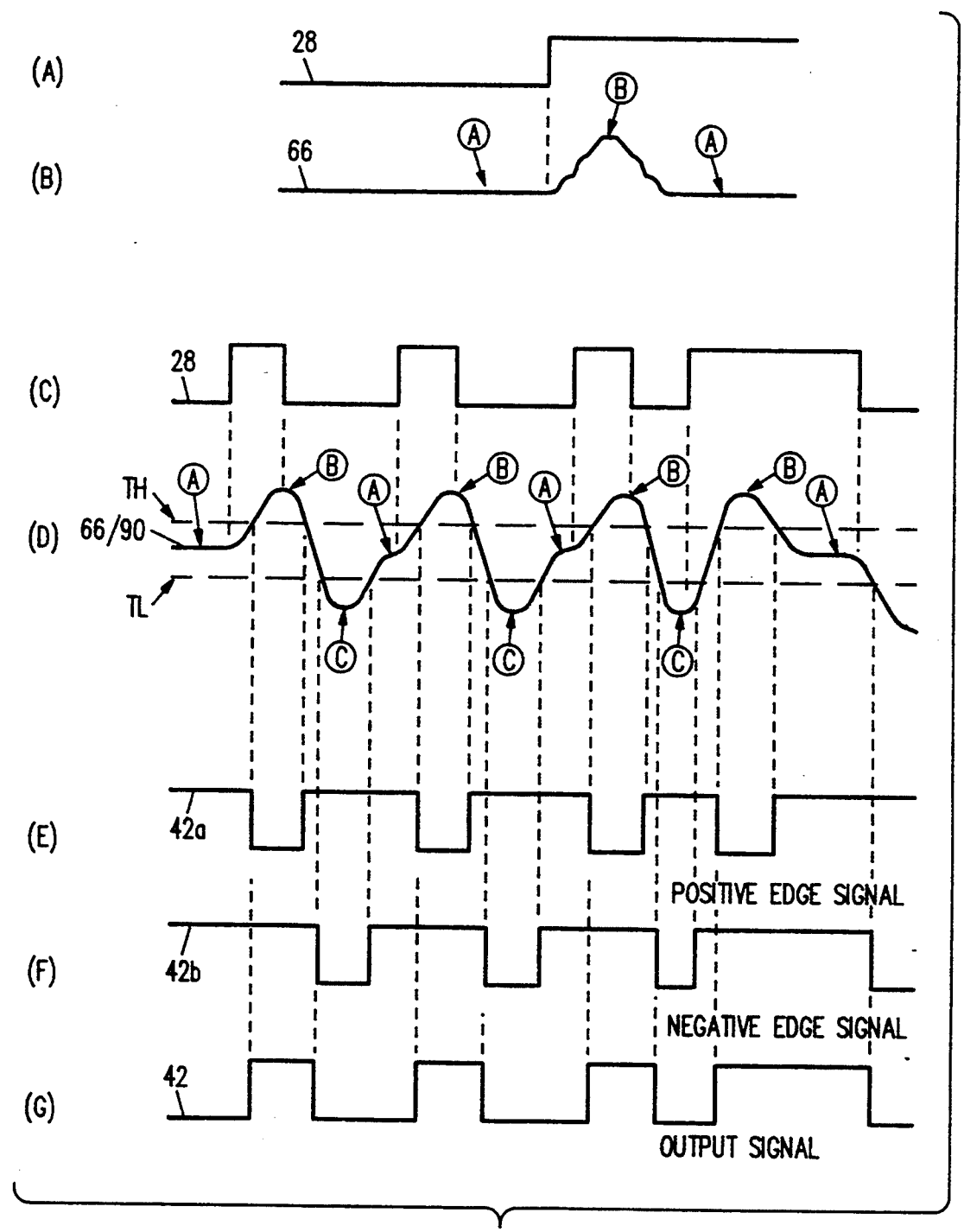
FIG. 3 illustrates exemplary signal waveforms for various signals within the data transceiver of FIG. 2.

Referring to FIG. 3, the frequency modulation of the VCO 46 output 34 and the demodulation and decoding of the receive data can be better understood. As discussed above, the transmit data 28 and receive data 42 are binary in form; however, in between, the data is trinary in form. In other words, the binary transmit data 28 is encoded to trinary data which is used to modulate the transmit signal 34 produced by the VCO 46 in the PLL 44. Similarly, the receive signal 36c is frequency modulated with trinary data representing binary data. The demodulated and filtered signal 90 also represents trinary data corresponding to the original binary transmit data 28. The decoding of this trinary data back to binary takes place within the amplitude window discriminator 78.

FIG. 3A shows a single positive data transition of the transmit data 28. This step input to the signal summer 56 (FIG. 2) produces a positive-going transient in the sum signal 64 which is filtered by the loop filter 54. In turn, this causes the VCO frequency control signal 66 to also have a positive-going transient, as shown in FIG. 3B. This positive transient in the VCO frequency control signal 66 causes the frequency of the VCO output signal 34 to increase accordingly. Similarly, the inverse is true, meaning that negative data transitions in the transmit data 28 produce negative transients in the VCO frequency control signal 66 and frequency of the output signal 34. However, within a brief period of time, the PLL 44 compensates for such output frequency transients (by appropriately adjusting the phase error signal 62), and the VCO frequency control signal 66 returns to its steady-state level. (In a preferred embodiment of the present invention, the duration of the transient depicted in FIG. 3B is approximately 8 microseconds.)

Accordingly, as seen in FIGS. 3C and 3D, a binary transmit data stream 28 produces a VCO frequency control signal 66 with positive and negative transients as shown. Those portions of the VCO frequency control signal 66 waveform labeled A correspond to the steady-state conditions after the PLL 44 has compensated for any transients induced by any positive or negative transmit data 28 transitions. Those portions labeled B are the positive transient peaks resulting from positive binary data transitions in the transmit data 28, and those portions labeled C are the negative transient peaks resulting from negative binary data transitions in the transmit data 28.

FIGS. 3C and 3D are also applicable when considering the demodulation and decoding of the receive signal by the receiver. On the receive side, FIG. 3D represents the filtered, demodulated signal 90 (trinary data) inputted to the amplitude window discriminator 78 (FIG. 2). The amplitude window discriminator 78, with internally set high TH and low TL thresholds (and enabled by the RSSI signal 84), decodes the trinary input data 90 into two intermediate data signals 42a and 42b, as shown in FIGS. 3E and 3F, respectively.

The first intermediate data signal 42a, as shown in FIG. 3E, is a "positive edge signal". This signal 42a is a binary signal whose trailing edges, i.e. negative transitions, occur at those points at which the trinary data 90 rises above the high threshold TH, and whose leading edges, i.e. positive transitions, occur at those points at which the trinary data 90 falls below the high threshold TH.

The second intermediate data signal 42b, as shown in FIG. 3F, is a "negative edge signal". This signal 42b is a binary signal whose trailing edges, i.e. negative transitions, occur at those points at which the trinary data 90 crosses below the low threshold TL, and whose leading edges, i.e. positive transitions, occur at those points at which the trinary data 90 rises above the low threshold TL.

These two intermediate data signals 42a and 42b are logically combined (e.g. by way of a set-reset flip-flop) to produce the binary receive data 42, as shown in FIG. 3G. As can be seen by comparing FIGS. 3C and 3G, the binary data is thereby faithfully reproduced.

Figure 4:
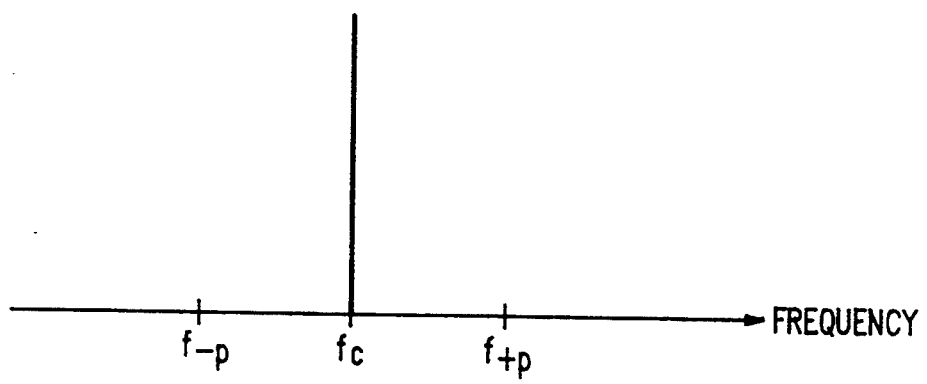
FIG. 4 illustrates exemplary frequency spectrums for the transmit and receive signals of the data transceiver of FIG. 2.
Figure 4:
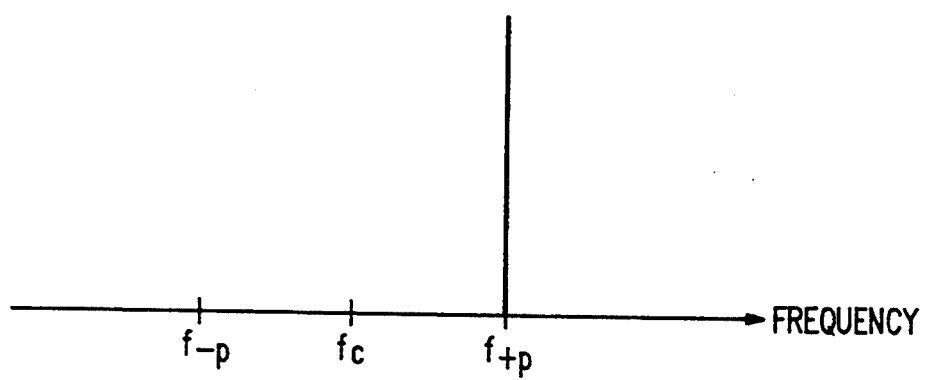
Figure 4:
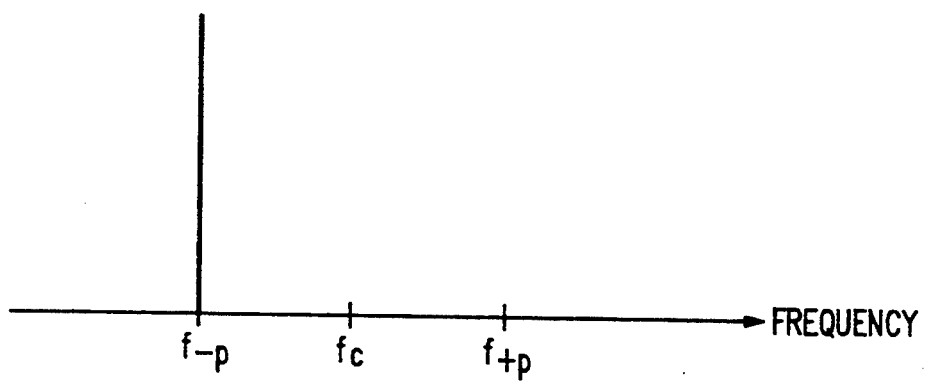

Referring to FIG. 4, the output frequency spectrum of the transmit signal 34 (and receive signal 36c) can be better understood. At the steady-state levels A of the VCO frequency control signal 66, the output frequency remains at the nominal carrier frequency $f_C = F1$ (commonly referred to as the "center" frequency). At the positive transient peaks B of the VCO frequency control signal 66, the output frequency increases to an upper "peak" frequency $f_{+P}$. At the negative transient peaks C of the VCO frequency control signal 66, the output frequency decreases to a lower "peak" frequency $f_{-p}$. Thus, the trinary data, as represented by the VCO frequency control signal 66, produces a frequency-modulated output signal 34.

Figure 5B:
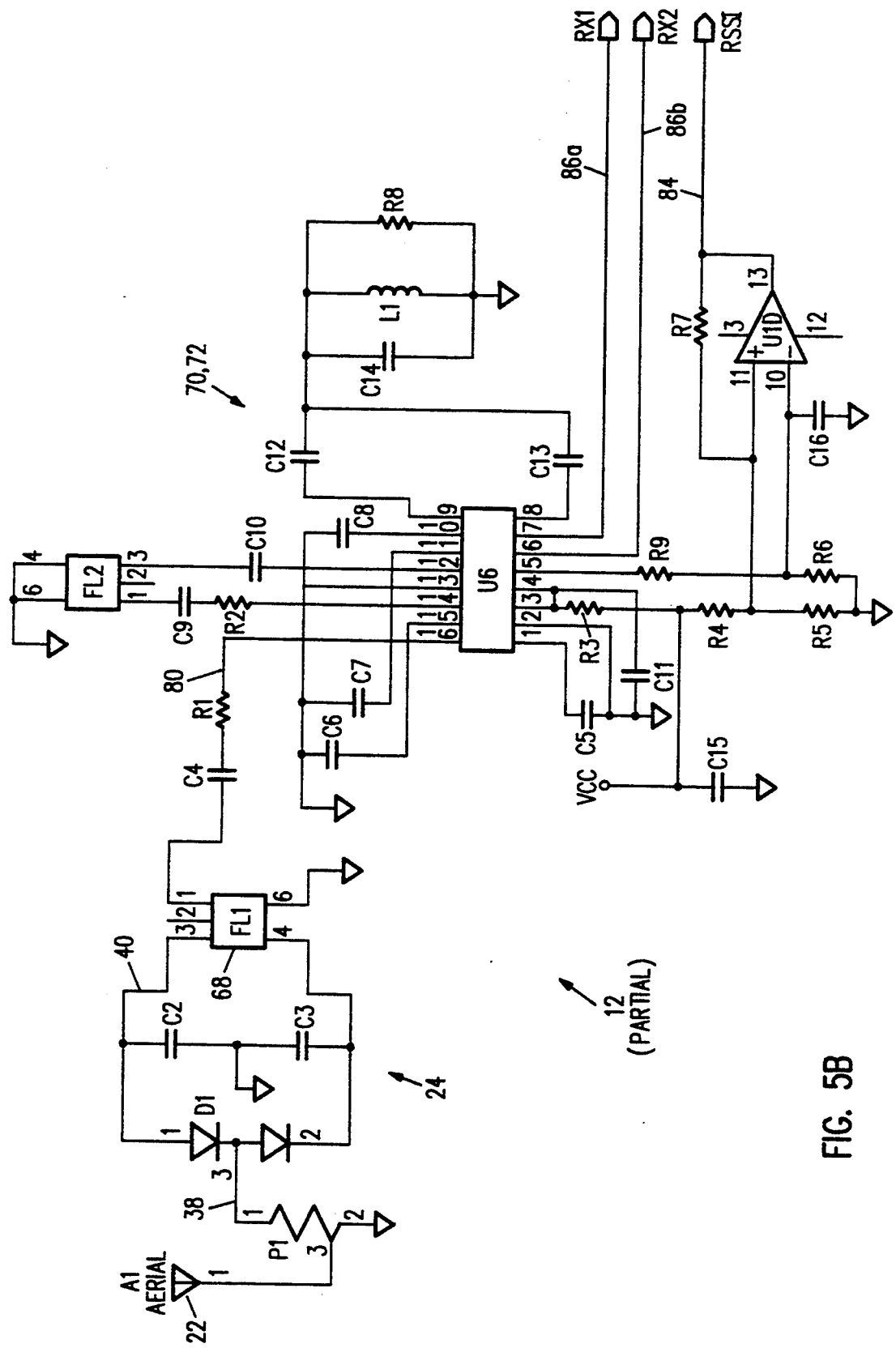
Figure 5C:
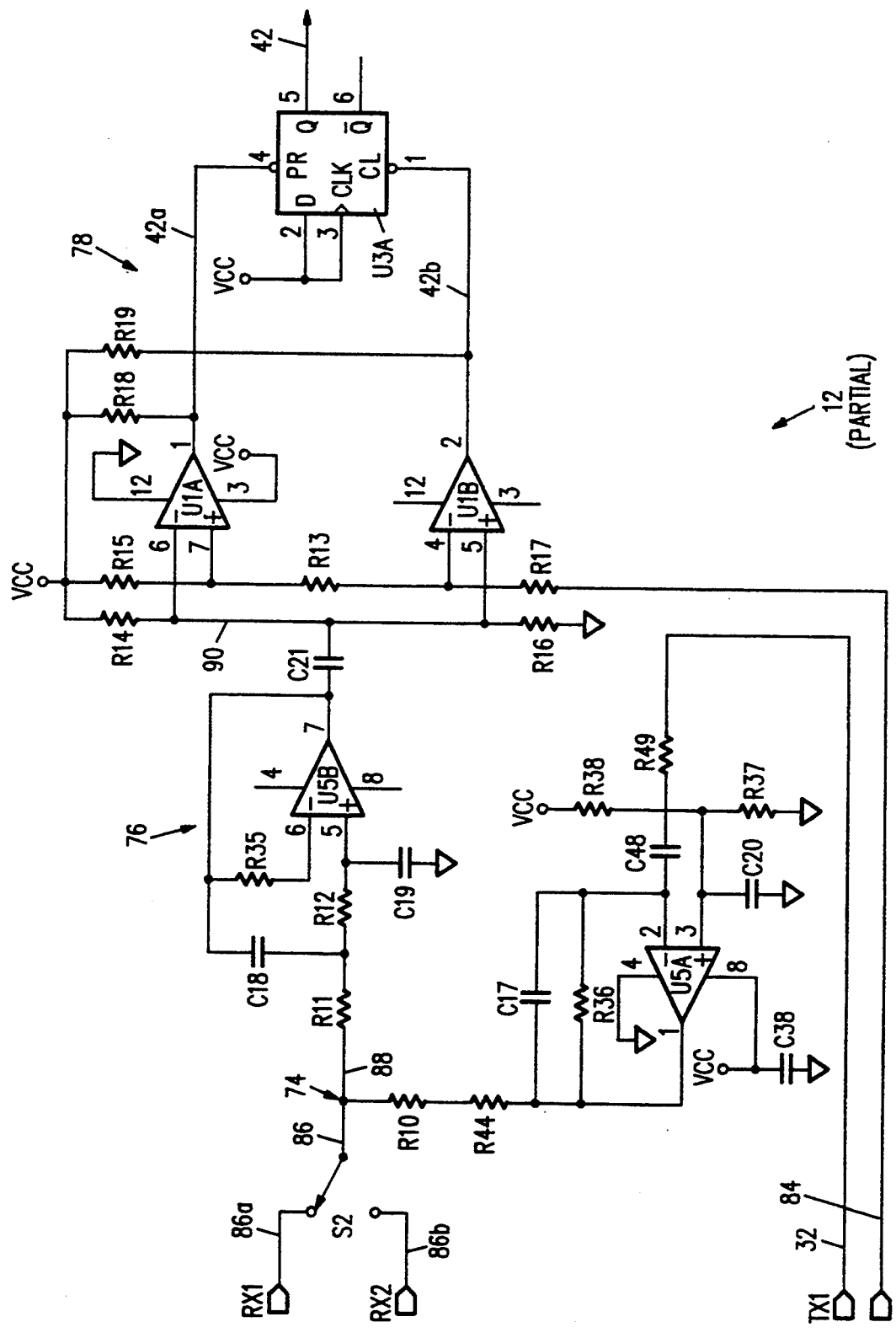

Referring to FIGS. 5A, 5B and 5C, a schematic of a preferred embodiment of a data transceiver 12 in accordance with the present invention will be used to further discuss the structure and operation of the present invention. Within the modulator-transmitter 18 (FIG. 1), the VCO 46 is a self-excited oscillator which includes transistor Q1 and a printed antenna element 20 (e.g. microstrip). The phase comparator 52 is an EXCLUSIVE-OR phase comparator U2B. The divide-by-N prescaler 48 is a divide-by-256/257 prescaler U7 (whose divide ratio is selectable with switch S1 to be either 256 or 257), the output of which is amplified and level-converted with two EXCLUSIVE-OR gates U2D and U2C connected as inverters. The final EXCLUSIVE-OR gate U2A, also connected as an inverter, operates with crystal Y1 (approximately 3.58 megahertz [MHz]) as a crystal oscillator for the frequency reference source 50.

As discussed above, the gain and frequency response of the PLL 44 are set, using the components and values as shown, so that a step input to the loop produces the transient response shown in FIG. 3B.

In the receiver, signals from the receive antenna 22 are matched to the mixer 24 with a resonant transmission line (e.g. microstrip). The mixer 24 uses a pair of Schottky diodes D1 connected in a single-balanced configuration to produce a balanced IF signal 40. The bandpass filter FL1 68 is a two-pole L-C filter (e.g. TOKO H354BAI-1425-DAD), and performs a balanced-to-unbalanced signal conversion, as well as provide selectivity at the IF frequency of approximately 3.5 MHz.

The IF amplifier 70 and frequency discriminator 72 are embodied within integrated circuit U6 (Signetics NE604). Additional IF filtering is provided by filter FL2 (e.g. TOKO H354BAI-1425-DAD), and elements C14, L1 and R8 form a quadrature network for use in the frequency discrimination performed by U6. Noninverted and inverted discriminator outputs 86a, 86b are available (discussed further below) using switch S2. The selected output 86 is summed with the modulation feedback signal 32 (which is inverted, amplified and phase-compensated with amplifier U5A with a phase delay to compensate for the receiver front-end phase delays), and then filtered in an active lowpass filter U5B.

The RSSI signal 84 is used to activate the window discriminator 78. This activation is achieved by using the output of voltage comparator U1D to selectively provide a current path to ground for the voltage divider R15, R13, R17 which provides the reference voltages for voltage comparators U1A and U1B. The action of the window discriminator 78 is to generate pulses for positive- and negative-going transitions in the original data stream as represented by the filtered, demodulated signal 90. The original data is then derived from a set-reset flip-flop U3A.

Switches S1 and S2 are used to establish the compatibility of a pair of data transceivers 12, 14 (FIG. 1) in accordance with the present invention. As discussed above, the transmitter frequency reference and the receiver IF are each approximately 3.58 MHz. Accordingly, the upper and lower peak frequencies are $f_C + 3.58$ MHz and $f_C - 3.58$ MHz, respectively. With switch S1 set to establish the divide ratio N of U7 at 256, the transmit carrier $f_C$ is approximately 916.48 MHz, and with switch S1 set to establish the divide ratio N of U7 at 257, the transmit carrier $f_C$ is approximately 920.06 MHz.

Switch S1 of the first data transceiver 12 is set for N=256 so that its transmit carrier frequency $f_C$ (and therefore its receiver LO signal 36b frequency) is 916.48 MHz, while switch S1 of the second data transceiver 14 is set for N=257 so that its transmit carrier frequency $f_C$ (and therefore its receiver LO signal 36d frequency) is 920.06 MHz. Therefore, with receiver IFs of 3.58 MHz (and no image frequency rejection), the first data transceiver 12 can receive and process signals centered about 912.90 MHz or 920.06 MHz, and the second data transceiver 14 can receive and process signals centered about 916.48 MHz or 923.64 MHz.

With these S1 switch settings, the first data transceiver 12 will receive and process the signals 36c centered about 920.06 MHz from the second data transceiver 14, and the second data transceiver 14 will receive and process the signals 36a centered about 916.48 MHz from the first data transceiver 12. This allows the data transceivers 12, 14 to operate without interfering with one another and with no self-jamming.

Furthermore, with these S1 switch settings, switch S2 of the first data transceiver 12 must be set so that the noninverted output 86a of the frequency discriminator 72 (U6 in FIG. 5) is selected, and switch S2 of the second data transceiver 14 must be set so that the inverted output 86b of the frequency discriminator 72 is selected. This ensures that the demodulated signals 90 processed by the amplitude window discriminators 78 of the data transceivers 12, 14 have the proper polarity.

Figure 6A:
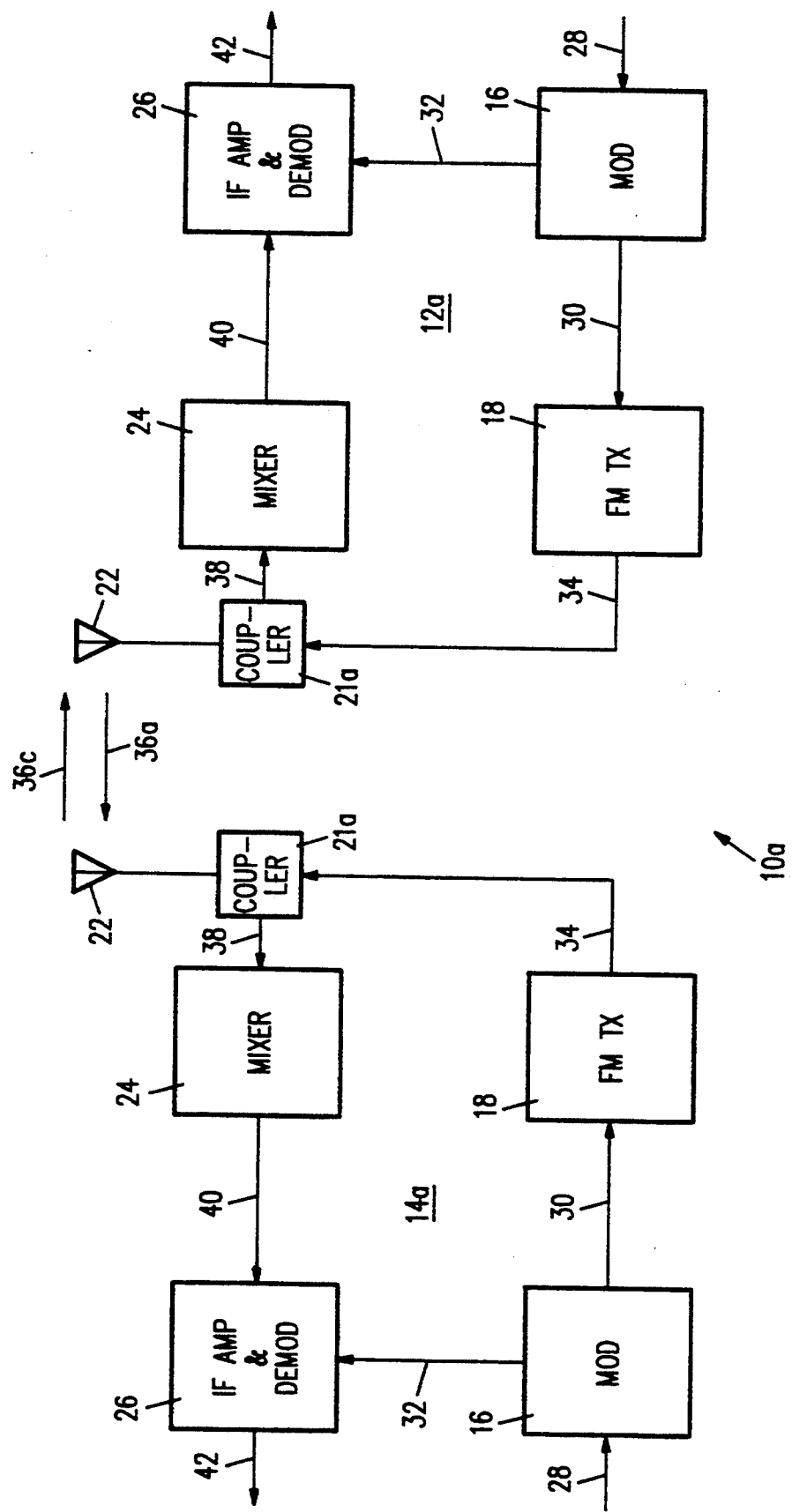
FIGS. 6A and 6B are functional block diagrams of data transceivers in accordance with an alternative preferred embodiment of the present invention.

Referring to FIG. 6A, a communication system 10a using two data transceivers 12a, 14a in accordance with an alternative preferred embodiment of the present invention includes the same elements as shown in FIG. 1, except for the addition of a signal coupler 21a and deletion of one antenna 20. (The transmitter and receiver sections in this embodiment operate as discussed above.) A single antenna 22 is shared by the transmitter and receiver sections and the receiver LO signal is provided by the transmitter to the receiver via the signal coupler 21a.

Figure 6B:
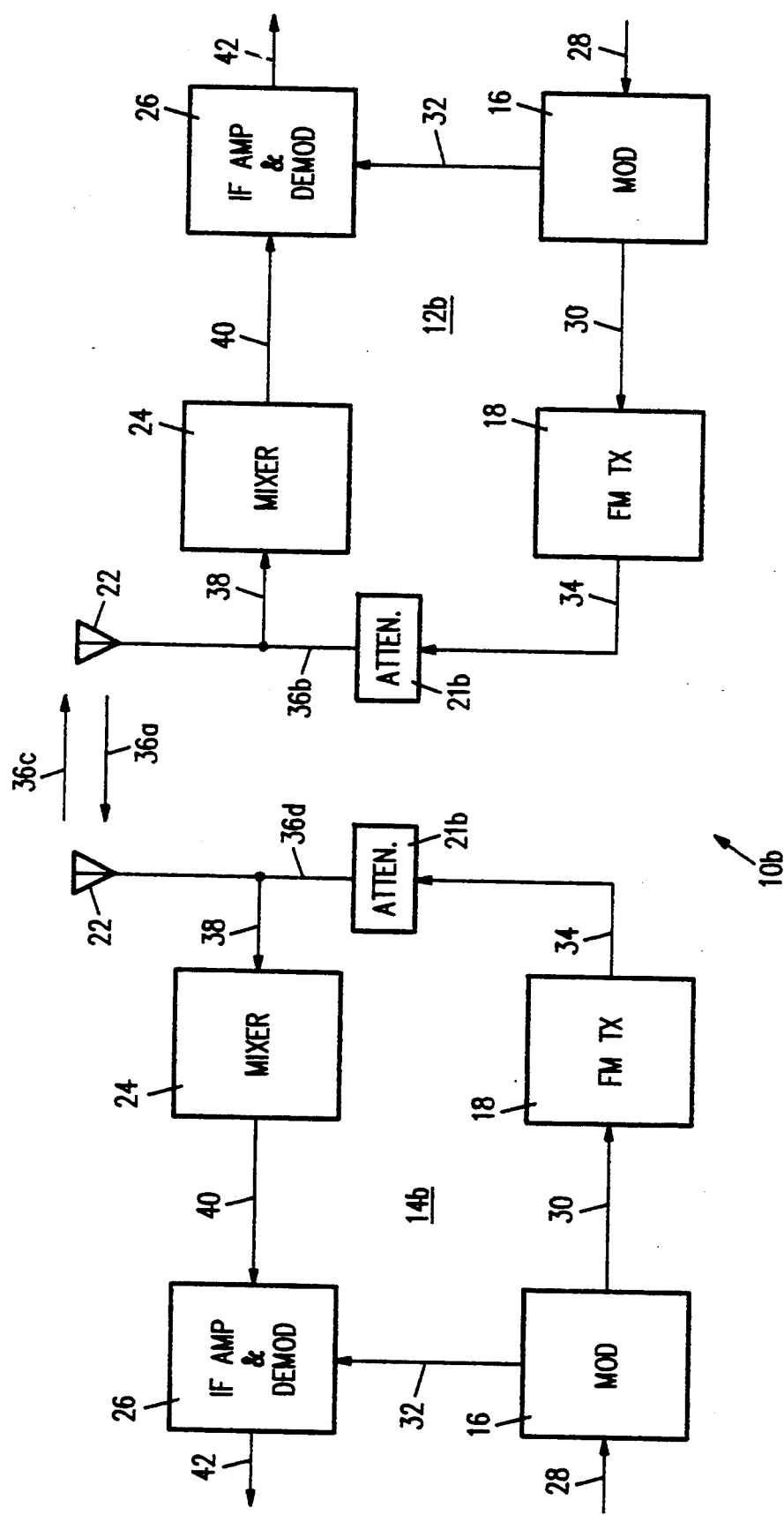

Referring to FIG. 6B, one form of signal coupler which can be used is a resistive attenuator 21b. Many forms of resistive attenuators are well known in the art and can be used to couple the desired amount of the RF output signal 34 into the receiver section (i.e. for use as the receiver LO signal), while still providing sufficient RF output signal 34 power to the antenna 22 for effective transmission thereof.

As can be seen, even though a hard-wired RF interface is used between the receiver and transmitter in the topology of FIGS. 6A and 6B, still only a single local oscillator is needed for each transceiver 12a/12b, 14a/14b. Moreover, all remaining benefits and advantages of the topology of FIG. 1, as discussed above, are achieved.

Figure 7:
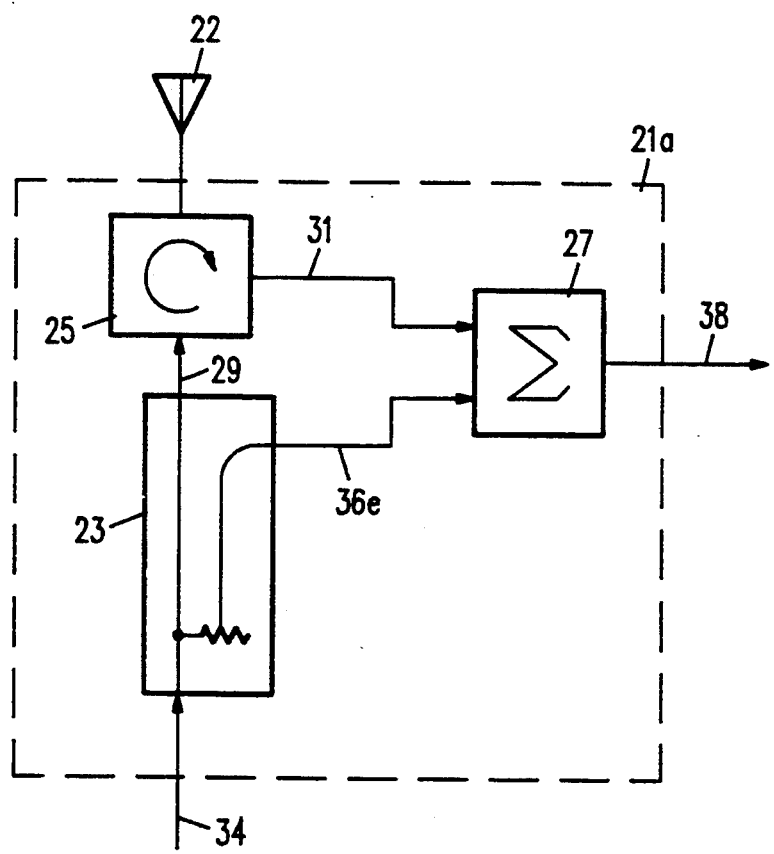
FIG. 7 illustrates an exemplary signal coupler for the data transceivers of FIG. 6A.

Referring to FIG. 7, an exemplary signal coupler 21a (FIG. 6A) can include a directional coupler 23, circulator 25 and signal combiner 27, connected substantially as shown. For signal transmission, the directional coupler 23 receives the RF output signal 34 and conveys a majority 29 thereof (with respect to signal power) to the circulator 25 for routing to the antenna 22 for transmission. For signal reception, the directional coupler 23 couples a minority 36e (with respect to signal power) of the RF output signal 34 to the signal combiner 27, which combines (e.g. sums) it with the incoming RF signal 31 routed from the antenna 22 by the circulator 25 to produce the combined signal 38 for the mixer 24 in the receiver section (discussed above).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments.

What is claimed is:

1. A data transceiver for transmitting and receiving modulated radio frequency (RF) signals, comprising:
   an antenna for transmitting a first modulated RF signal and receiving a second modulated RF signal;
   signal coupler means coupled to said antenna for receiving and coupling thereto a first portion of said first modulated RF signal and for receiving and coupling therefrom said second modulated RF signal;
   transmitter means coupled to said signal coupler means for receiving a first modulation signal M1 and generating therefrom a second modulation signal M2, generating a RF signal having a first carrier frequency F1, modulating said RF signal in accordance with said first modulation signal M1, and providing said modulated RF signal to said signal coupler means as said first modulated RF signal; and
   receiver means coupled to said signal coupler means and said transmitter means for receiving via said signal coupler means said second modulated RF signal which includes a second carrier frequency F2 modulated by a third modulation signal M3, receiving further via said signal coupler means a second portion of said first modulated RF signal, and mixing said received second portion of said first modulated RF signal and said received second modulated RF signal to produce a modulated intermediate frequency (IF) signal having a modulated center frequency F3 equal to a difference $|F1-F2|$ between said first carrier frequency F1 and said second carrier frequency F2, and further for receiving from said transmitter means said second modulation signal M2 and in accordance therewith demodulating said modulated IF signal.

2. A data transceiver as recited in claim 1, wherein said signal coupler means comprises an attenuator.

3. A data transceiver as recited in claim 1, wherein said signal coupler means comprises a directional coupler for receiving said first modulated RF signal, outputting said first portion of said first modulated RF signal to said antenna and coupling said second portion of said first modulated RF signal to said receiver means.

4. A data transceiver as recited in claim 1, wherein said transmitter means comprises a phase-lock-loop which includes a frequency-controllable oscillator, wherein a frequency error signal is generated and combined with said received first modulation signal M1 to produce a frequency control signal for said frequency-controllable oscillator.

5. A data transceiver as recited in claim 4, wherein said first modulated RF signal comprises a frequency-modulated signal.

6. A data transceiver as recited in claim 4, wherein said frequency control signal comprises said second modulation signal M2.

7. A data transceiver as recited in claim 1, wherein said receiver means comprises:
   an IF circuit for receiving and mixing said second portion of said first modulated RF signal and said second modulated RF signal to produce said modulated IF signal; and
   a demodulator connected to said IF circuit for receiving said second modulation signal M2 and in accordance therewith receiving and demodulating said modulated IF signal.

8. A data transceiver as recited in claim 7, wherein said IF circuit comprises a single-input mixer which receives said first and second modulated RF signals on a single signal line from said receiver antenna.

9. A data transceiver as recited in claim 7, wherein said demodulator comprises a frequency discriminator.

10. A data transceiver as recited in claim 1, wherein said receiver means comprises:
    an IF circuit for receiving and mixing said second portion of said first modulated RF signal and said second modulated RF signal to produce said modulated IF signal; and
    a demodulator connected to said IF circuit for receiving and demodulating said modulated IF signal to produce a baseband signal, and for receiving and subtracting said second modulation signal M2 from said baseband signal.

11. A data transceiver as recited in claim 10, wherein said IF circuit comprises a single-input mixer which receives said first and second modulated RF signals on a single signal line from said receiver antenna.

12. A data transceiver as recited in claim 10, wherein said demodulator comprises a frequency discriminator.

13. A data transceiver for transmitting and receiving modulated radio frequency (RF) signals, comprising:
    an antenna which transmits a first modulated RF signal and receives a second modulated RF signal;
    a signal coupler, connected to said antenna, which receives and couples thereto a first portion of said first modulated RF signal and receives and couples therefrom said second modulated RF signal;
    a modulator-transmitter, connected to said signal coupler, which receives a first modulation signal M1 and generates therefrom a second modulation signal M2, generates a RF signal having a first carrier frequency F1, modulates said RF signal in accordance with said first modulation signal M1, and provides said modulated RF signal to said signal coupler as said first modulated RF signal; and
    a demodulator-receiver, connected to said signal coupler and said modulator-transmitter, which receives via said signal coupler said second modulated RF signal including a second carrier frequency F2 modulated by a third modulation signal M3, receives further via said signal coupler a second portion of said first modulated RF signal, and mixes said received second portion of said first modulated RF signal and said received second modulated RF signal to produce a modulated intermediate frequency (IF) signal having a modulated center frequency F3 equal to a difference $|F1-F2|$ between said first carrier frequency F1 and said second carrier frequency F2, and further which receives from said modulator-transmitter said second modulation signal M2 and in accordance therewith demodulates said modulated IF signal.

14. A data transceiver as recited in claim 13, wherein said signal coupler comprises an attenuator.

15. A data transceiver as recited in claim 13, wherein said signal coupler comprises a directional coupler which receives said first modulated RF signal, outputs said first portion of said first modulated RF signal to said antenna and couples said second portion of said first modulated RF signal to said demodulator-receiver.

16. A data transceiver as recited in claim 13, wherein said modulator-transmitter comprises a phase-lock-loop which includes a frequency-controllable oscillator, wherein a frequency error signal is generated and combined with said received first modulation signal M1 to produce a frequency control signal for said frequency-controllable oscillator.

17. A data transceiver as recited in claim 16, wherein said first modulated RF signal comprises a frequency-modulated signal.

18. A data transceiver as recited in claim 16, wherein said frequency control signal comprises said second modulation signal M2.

19. A data transceiver as recited in claim 13, wherein said demodulator-receiver comprises:
an IF circuit which receives and mixes said second portion of said first modulated RF signal and said second modulated RF signal to produce said modulated IF signal; and
a frequency demodulator, connected to said IF circuit, which receives and frequency-demodulates said modulated IF signal to produce a baseband signal, and which receives and subtracts said second modulation signal M2 from said baseband signal.

20. A data transceiver as recited in claim 19, wherein said IF circuit comprises a single-input mixer which receives said first and second modulated RF signals on a single signal line from said signal coupler.

21. A data transceiving method for transmitting and receiving modulated radio frequency (RF) signals, comprising the steps of:
receiving a first modulation signal M1 and generating a second modulation signal M2 therefrom;
generating a RF signal having a first carrier frequency F1;
modulating said RF signal in accordance with said first modulation signal M1;
transmitting said modulated RF signal as a first modulated RF signal via an antenna;
receiving via said antenna a second modulated RF signal having a second carrier frequency F2 modulated by a third modulation signal M3;
receiving via a signal coupler a portion of said first modulated RF signal;
mixing said received portion of said first modulated RF signal and said received second modulated RF signal to produce a modulated intermediate frequency (IF) signal having a modulated center frequency F3 equal to a difference $|F1-F2|$ between said first carrier frequency F1 and said second carrier frequency F2; and
receiving said second modulation signal M2 and in accordance therewith demodulating said modulated IF signal.

22. A data transceiving method as recited in claim 21, wherein said step of generating a RF signal having a first carrier frequency F1 comprises generating a frequency error signal in a phase-lock-loop which includes a frequency-controllable oscillator and combining said frequency error signal with said first modulation signal M1 to produce a frequency control signal for said frequency-controllable oscillator.

23. A data transceiving method as recited in claim 22, wherein said step of modulating said RF signal in accordance with said first modulation signal M1 comprises frequency-modulating said RF signal in accordance with said first modulation signal M1.

24. A data transceiving method as recited in claim 22, wherein said step of modulating said RF signal in accordance with said first modulation signal M1 comprises modulating said RF signal with said second modulation signal M2 as said frequency control signal.

25. A data transceiving method as recited in claim 21, wherein said step of receiving via a signal coupler a portion of said first modulated RF signal comprises receiving said first modulated RF signal portion via an attenuator.

26. A data transceiving method as recited in claim 21, wherein said step of mixing said received portion of said first modulated RF signal and said received second modulated RF signal to produce a modulated IF signal comprises inputting said first and second modulated RF signals to a single-input mixer on a single signal line from said signal coupler.

27. A data transceiving method as recited in claim 21, wherein said step of receiving said second modulation signal M2 and in accordance therewith demodulating said modulated IF signal comprises demodulating said modulated IF signal to produce a baseband signal and subtracting said second modulation signal M2 from said baseband signal.

28. A data transceiving method as recited in claim 27, wherein said step of demodulating said modulated IF signal to produce a baseband signal comprises frequency discriminating said modulated IF signal.

* * * * *